United States Patent [19]
Ohba

[11] Patent Number: 5,990,495
[45] Date of Patent: *Nov. 23, 1999

[54] SEMICONDUCTOR LIGHT-EMITTING ELEMENT AND METHOD FOR MANUFACTURING THE SAME

[75] Inventor: Yasuo Ohba, Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/683,381

[22] Filed: Jul. 18, 1996

[30] Foreign Application Priority Data

Aug. 25, 1995 [JP] Japan .................... 7-217875

[51] Int. Cl.$^6$ .................................................. H01L 33/00
[52] U.S. Cl. .......................... 257/94; 257/79; 257/13
[58] Field of Search ............................. 257/77, 76, 94, 257/79, 12, 13

[56] References Cited

U.S. PATENT DOCUMENTS 5,247,533 9/1993 Okazaki et al. ........................... 372/45
5,290,393 3/1994 Nakamura ............................... 156/613
5,523,589 6/1996 Edmond et al. .......................... 257/77

OTHER PUBLICATIONS

S. Yoshida, et al., "Improvements on the Electrical and Luminesceent Properties of Reactive Molecular Beam Epitaxially Grown GaN Films by Using AlN–coated Sapphire Substrates". Appl. Phys. Lett., vol. 42, (pp. 427–429), Mar. 1, 1983.

K. Hiramatsu, et al., "Growth Mechanism of GaN Grown on Sapphire with AlN Buffer Layer by MOVPE". Journal of Crystal Growth, vol. 115, (pp. 628–633), 1991.

P. Kung, et al., "High Quality AlN and GaN Epilayers Grown on (00•1) Sapphire, (100), and (111) Silicon Substrates". Appl. Phys. Lett., vol. 66, (pp. 2958–2960), May 29, 1995.

*Primary Examiner*—Nathan K. Kelley
*Attorney, Agent, or Firm*—Oblon, Spivak, McClelland, Maier & Neustadt, P.C.

[57] ABSTRACT

A semiconductor light-emitting element comprising a monocrystal substrate; a buffer layer formed directly on the monocrystal substrate and comprising a monocrystal $Al_xGa_{1-x}N$ layer ($0<x<1$); and element-forming layer formed on the buffer layer and comprising $Al_xGa_yIn_{1-x-y}N$ ($0 \leq x+Y \leq 1$, $0 \leq x$, $Y \leq 1$). The half-value width of an X-ray rocking curve of the buffer layer should preferably be 5 minutes or less, more preferably 90 seconds or less.

12 Claims, 4 Drawing Sheets

SEMICONDUCTOR LIGHT-EMITTING ELEMENT AND METHOD FOR MANUFACTURING THE SAME

BACKGROUND OF THE INVENTION

1. Field of the Invention

This invention relates to a Group III–V compound semiconductor, and in particular to a semiconductor light-emitting element and also to a method of manufacturing the semiconductor light-emitting element.

2. Description of the Related Art

The GaN and GaN-based mixed crystals, each representing one of the Group III–V compound semiconductor containing nitrogen, are large in band gap, i.e. 3.4 eV or more and hence are of direct transition type, so that these mixed crystals are expected to be useful as a material for a short wavelength semiconductor laser element. For example, a bright blue LED exhibiting a luminance of the order of 1 candela has been realized by making use of these mixed crystals. However, as far as a semiconductor laser is concerned, the use of these mixed crystals so far reported is limited to those which is capable of performing a pulse operation based on an optical excitation. Namely, up to date, it has been failed to realize a semiconductor laser which is capable of performing a laser operation through the injection of current.

As for the structure of light-emitting element now studied, a hetrojunction where GaN or GaInN containing a small content of In is employed as an active layer for generating light and AlGaN is employed as a confinement layer for confining light and electrons is considered to be promising. In order to obtain a semiconductor laser which is capable of effecting a continuous operation at room temperature, the film thickness of the confinement layer is required to be sufficiently thick so as to achieve sufficiently high confinement effects. Furthermore, a difference in forbidden band width between a light-emitting layer and a confinement layer is required to be sufficiently large and at the same time a heterojunction having a flat interface is required to be formed.

According to the studies made by the present inventors, the mole fraction (x) of Al in a composition of $Al_xGa_{1-x}N$ is required to be at least 0.15, preferably 0.25 to 1.0. In view of mismatching in lattice between the confinement layer and the active layer, the upper limit of the mole fraction (x) should desirably be 0.5 or less. Moreover, as far as the range of wavelength from blue to near ultraviolet ray is concerned, the film thickness of the confinement layer should be at least 0.3 $\mu$m, preferably in the range of from 0.5 $\mu$m to 1 $\mu$m.

However, it is fundamentally very difficult according to the conventional technique to form a flat and thick AlGaN layer having a high Al content. Since a substrate of high quality which is capable of matching in lattice with a GaN-based material has been failed to be found so far, a sapphire has been extensively employed as a substrate for forming GaN thereon. However, since the mismatching in lattice between sapphire and the GaN is as large as 15% or so, the GaN is more likely to be grown in the shape of an island.

In an attempt to alleviate any influence from the mismatching in lattice between sapphire and the GaN, a method of forming an AlGaN layer on the surface of a buffer layer formed in advance on a substrate has been employed. According to this method, a very thin amorphous or polycrystalline AlN or GaN film is formed as a buffer layer on a sapphire substrate by way of a low temperature growth. In this case, since the amorphous or polycrystalline film functions to alleviate any thermal strain, the fine crystals included in the interior of the buffer layer would become seed crystals which are uniform in crystal orientation at the occasion of heating up to 1,000° C. As a result, the quality of crystal of the AlGaN layer formed on the buffer layer is considered to be improved.

When the aforementioned method is employed, the quality of crystal represented for example by a half-value width of X-ray diffraction depends greatly on the conditions of growing the buffer layer constituting an underlying layer. For example, if the buffer layer is relatively thick, the orientation of the seed crystals constituting nuclei for crystal growth may be disordered, so that the quality of crystal of the AlGaN layer formed on the buffer layer would be deteriorated. The aforementioned half-value width may be decreased as the thickness of the buffer layer becomes thinner. However, when the film thickness of the buffer layer is 10 $\mu$m or less, the surface conditions of the crystal may become abruptly deteriorated.

As explained above, the conventional method is defective in that the crystal of a compound semiconductor layer that has been grown directly on the buffer layer is more likely to be poor in quality, and it is difficult to obtain a compound semiconductor layer, particularly in the case of AlGaN, having a half-width value of not more than one minute in the X-ray diffraction. If the film thickness of the AlGaN layer is increased in view of improving the quality thereof, cracks may be generated in the AlGaN layer. These phenomena are more conspicuous in the case of the AlGaN to be used as a confinement layer.

Figure 1:
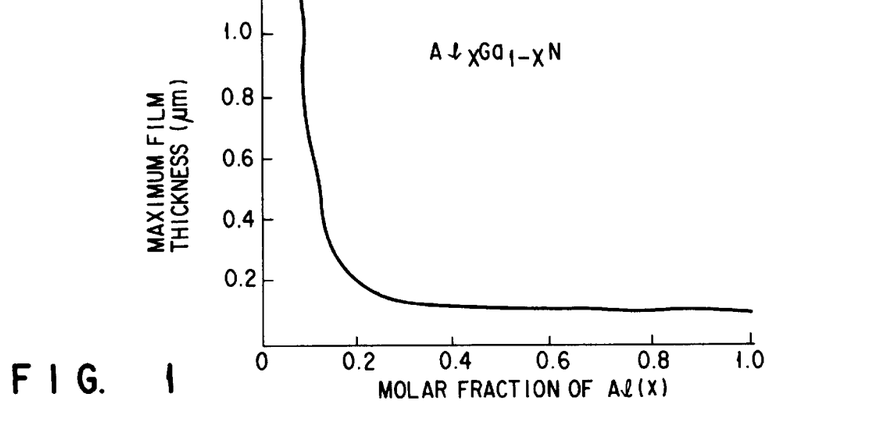
FIG. 1 is a graph showing a relationship between Al molar fraction "x" in $Al_xGa_{1-x}N$ and the maximum film thickness which enables the growth of crystal layer to be effected without giving rise to the generation of cracks.

FIG. 1 represents the relationship between the molar fraction of Al in $Al_xGa_{1-x}N$ and the maximum film thickness which enables the growth of crystal layer to be effected without giving rise to the generation of cracks. According to the aforementioned conventional method, if an $Al_xGa_{1-x}N$ layer having a film thickness of not less than 0.3 $\mu$m is to be formed without inviting cracks, the molar fraction of Al (x) is required to be restricted to less than 0.15. As a result, the growth conditions of the buffer layer will be extremely restricted. Furthermore, the quality of the crystal of the buffer layer obtained in this manner is also not excellent. These problems have been main obstacles to the manufacture of a bright light-emitting diode or a semiconductor laser requiring as a confinement layer the employment of an AlGaN of high quality and large film thickness.

The reason for employing an amorphous or polycrystalline material for a buffer layer consisting of AlN or GaN in the conventional method is due to the fact that $NH_3$ gas is employed as a nitrogen source. Namely, in the growth of the buffer layer using $NH_3$ gas, the growth is required to be carried out at a low temperature of less than 600° C. in order to inhibit the reaction between the $NH_3$ gas and the substrate. Therefore, the resultant layer formed under such a low temperature condition inevitably becomes amorphous or polycrystalline. It has been considered that even if the buffer layer is to be formed in the form of monocrystal, the quality of the resultant monocrystal would be badly deteriorated so that a layer to be grown on such a buffer layer would become rather poor in quality of crystal.

As explained above, it has been very difficult up to date to grow in good reproducibility an AlGaIn-based semiconductor layer of excellent quality and sufficient thickness on a substrate which mismatches in lattice with the AlGaIn-based semiconductor layer. This has been a cause of deteriorating the yield in the manufacture of a bright short wavelength light-emitting element or a short wavelength semiconductor laser.

SUMMARY OF THE INVENTION

Accordingly, an object of the present invention is to provide a semiconductor light-emitting element which enables the growth of an AlGaIn-based semiconductor layer of excellent quality and suitable thickness in good reproducibility on a substrate which mismatches in lattice with the AlGaIn-based semiconductor layer, and also enables the manufacture of a bright short wavelength light-emitting element or a short wavelength semiconductor laser in high yield.

Another object of this invention is to provide a method of manufacturing a semiconductor light-emitting element which enables the growth of an AlGaIn-based semiconductor layer of excellent quality on a substrate which mismatches in lattice with the AlGaIn-based semiconductor layer.

Namely, according to the present invention, there is provided a semiconductor light-emitting element comprising:

a monocrystal substrate;

a buffer layer formed directly on said monocrystal substrate and comprising a monocrystal $Al_xGa_{1-x}N$ layer (0<x<1); and an element-forming layer formed on said buffer layer and comprising $Al_xGa_yIn_{1-x-y}N$ (0≦x+Y≦1, 0≦x, Y≦1).

The half-value width of an X-ray rocking curve of the buffer layer should preferably be 5 minutes or less, more preferably 90 seconds or less. The element-forming layer should preferably be constructed to constitute a heterojunction structure.

The heterojunction structure is preferably formed of a laminated layer comprising a first confinement layer constituted by $Al_pGa_{1-p}N$ (0<p≦1), an active layer constituted by a compound selected from the group consisting of GaN, GaInN, AlGaN and AlGaInN, and a second confinement layer constituted by $Al_qGa_{1-q}N$ (0<q≦1), laminated in the mentioned order. In this case, the film thickness of the first confinement layer should preferably be more than 0.3 µm and the Al molar fraction p should preferably be in a range of 0.25<p≦1. It is also preferable that any layer containing a lower molar fraction of Al than that in said first confinement layer is not interposed between the substrate and the active layer.

According to this invention, the aforementioned monocrystal substrate is preferably formed of sapphire or SiC.

According to the present invention, there is further provided a method of forming a semiconductor light-emitting element comprising the steps of:

growing a buffer layer directly on a monocrystal substrate at a first temperature by way of a MOCVD method, said buffer layer being formed of a monocrystal $Al_xGa_{1-x}N$ layer (0<x<1); and growing an element-forming layer on said buffer layer at a second temperature which is lower than said first temperature by way of a MOCVD method, said element-forming layer being formed of $Al_xGa_yIn_{1-x-y}N$ (0≦x+Y≦1, 0≦x, Y≦1).

The temperature for growing the buffer layer should preferably be higher than 1,300° C. Further, the flow rate of $NH_3$ gas as a nitrogen source in the step of growing the buffer layer should preferably be as sufficiently small as possible.

DETAILED DESCRIPTION OF THE PREFERRED EMBODIMENTS

First, the present inventors have investigated the cause of the abrupt generation of cracks in an element-forming layer (an element growth layer) such as an AlGaInN when the film thickness of the element-forming layer being formed on a buffer layer exceeds over a certain value. By the way, it has been conventionally considered that cracks would be generated during the cooling process after the growth of the element-forming layer due to the difference in thermal expansion coefficient between the substrate and the grown element-forming layer. However it has been found as a result of the studies made by the present inventors that the cracks are caused to generate not at the cooling process but during the growing process of the element-forming layer. Namely, since the effect to alleviate the strain by the buffer that has been grown at a low temperature according to the conventional method is insufficient, the strain due to a difference in lattice constant between the substrate and the element-forming layer is caused to accumulate in the element-forming layer in simultaneous with the growth of the element-forming layer. This is the true reason for the generation of cracks. On the other hand, the reason for the abrupt tendency to generate cracks as the molar fraction of Al becomes large may be ascribed to the fact that the flexibility resulting from the movement of dislocation decreases with an increase in the molar fraction of Al.

Therefore, if a crystal can be grown at such a high temperature that enables the dislocation to fully move, the cracks may be effectively inhibited. The limitation on film thickness for avoiding the generation of cracks also depends on the quality of the element-forming layer. For example, the narrower the half-value width of X-ray diffraction is, the less the generation of cracks would be resulted. In particular, when the half-value width becomes 5 minutes or less, the generation of cracks would be extremely minimized. Accordingly, if an AlGaN layer containing a high molar fraction of Al and having a sufficient film thickness is to be grown without generating cracks, the quality of crystal of the buffer layer itself is required to be markedly improved. For this purpose, it is required to improve the quality of crystal of the buffer layer and to effectively alleviate the mismatching between the buffer layer and the substrate without deteriorating the crystal quality of a growth layer to be formed on the buffer layer.

Since the conventional buffer layer formed at a lower temperature is poor in crystal quality, it is impossible to meet the aforementioned requirements. Namely, there is a fundamental limitation according to the conventional buffer layer with regard to any attempt to markedly improve the quality of crystal. In view of this, the present inventors have made extensive studies to finally find out a fact that a monocrystal which is narrow in X-ray half-value width, or a monocrystal of excellent quality is most suited for use as a buffer layer.

In order to grow a crystal monocrystal buffer layer, a crystal growth is required to be performed at a high temperature. However, if the crystal growth is performed at a high temperature, a reaction between $NH_3$ gas and the substrate would be caused to occur as mentioned above, so that the surface of the resultant buffer layer may be damaged.

Therefore, according to this invention, the crystal growth is performed at a high temperature with the flow rate of $NH_3$ gas being minimized, thereby effecting a moderate crystal growth. Therefore, it is possible according to this invention to grow a buffer layer of such a high quality that the prior art has failed to achieve up to date. Accordingly, it has now become possible to realize the manufacture of a bright short wavelength light-emitting element such as a semiconductor laser by simply growing an AlGaN-based element-forming layer on this buffer layer.

This invention will be explained further with reference to the following examples.

Figure 2:
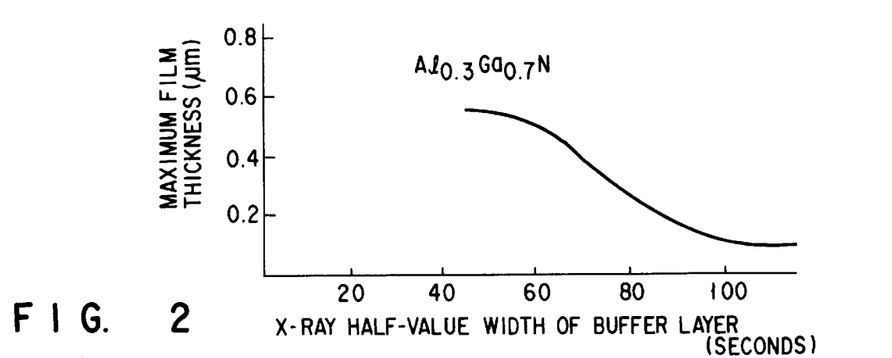
FIG. 2 is a graph showing a relationship between an X-ray half-value width of an AlN(Ga) buffer layer and the maximum film thickness which enables the growth of an AlGaN layer to be effected without giving rise to the generation of cracks in the AlGaN layer.

FIG. 2 is a graph showing a relationship between an X-ray half-value width of an AlN(Ga) buffer layer and the maximum film thickness of an $Al_{0.3}Ga_{0.7}N$ layer formed on the buffer layer which enables the growth of the $Al_{0.3}Ga_{0.7}N$ layer to be effected without giving rise to the generation of cracks in the $Al_{0.3}Ga_{0.7}N$ layer. The film thickness of the $Al_{0.3}Ga_{0.7}N$ layer as a confinement layer should preferably be 0.2 $\mu$m or more, and more preferably 0.5 $\mu$m or more. Therefore, it will be understood from FIG. 2 that the X-ray half width for the buffer layer is required to be 90 seconds or less, more preferably 60 seconds or less.

Figure 3:
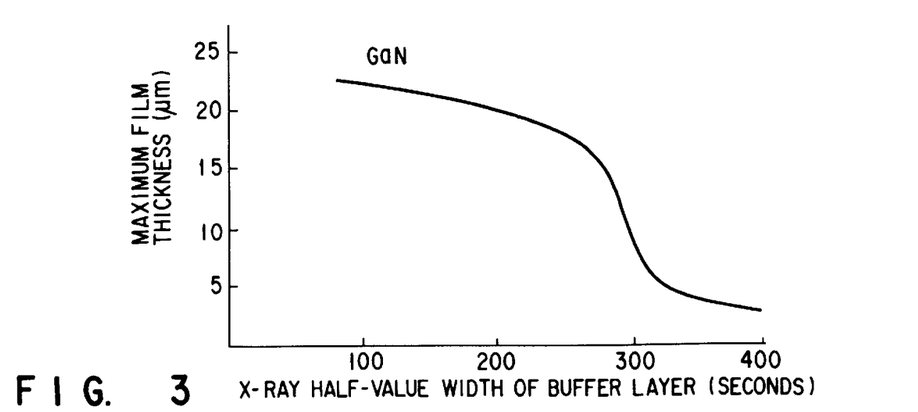
FIG. 3 is a graph showing a relationship between an X-ray half-value width of an AlN(Ga) buffer layer and the maximum film thickness which enables the growth of a GaN layer to be effected without giving rise to the generation of cracks in the GaN layer.

FIG. 3 shows a relationship between an X-ray half-value width of an AlN(Ga) buffer layer and the maximum film thickness of a GaN layer formed on the buffer layer which enables the growth of the GaN layer to be effected without giving rise to the generation of cracks in the GaN layer. As seen from FIG. 3, when the half-value width of the buffer layer exceeds over 5 minutes, the film thickness of the GaN was abruptly decreased. Therefore, if the film thickness of the GaN layer functioning as a confinement layer is to be increased, the half-value width of the buffer layer should be controlled to 5 minutes or less, more preferably to 3 minutes or less. X-ray diffraction is performed by 2θ scanning using reflection of "0002" face with $K\alpha_1$-line of Cu.

As clearly seen from the comparison between FIG. 2 and FIG. 3, the maximum film thickness of the GaN layer is larger than that of the $Al_{0.3}Ga_{0.7}N$ layer, and the X-ray half-value width of the GaN layer is not required to be so restricted. This is because of the fact that GaN is more resistive to the generation of cracks as compared with AlGaN.

Figure 4:
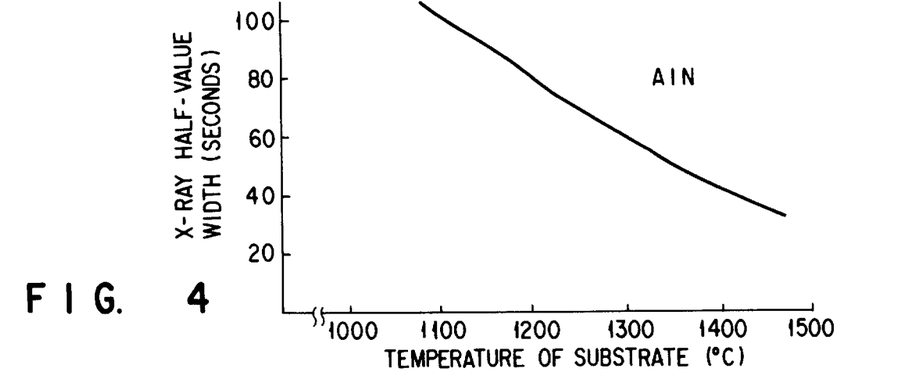
FIG. 4 is a graph showing the relationship between the temperature for growing an AlN(Ga) buffer layer and the X-ray half-value width of the buffer layer.

FIG. 4 shows the relationship between the temperature for growing an AlN(Ga) buffer layer (the temperature of substrate) and the X-ray half-value width of the buffer layer. As seen from the graph shown in FIG. 4, the higher the temperature for growing the buffer layer is, the smaller the X-ray half-value width of the buffer layer becomes. Namely, when the $Al_{0.3}Ga_{0.7}N$ layer is to be grown on the buffer layer, the temperature for growing the buffer layer is required to be 1,200° C. or more if the X-ray half-value width thereof is desired to be controlled to not more than 90 seconds, and 1,300° C. or more if the X-ray half-value width thereof is desired to be controlled to not more than 60 seconds.

When the sapphire substrate is compared with GaN or GaN-based mixed crystal with respect to the lattice constant in the direction of "a" axis, the sapphire substrate is smaller in the lattice constant than GaN or GaN-based mixed crystal. This can be ascribed to the fact that the crystal orientation of the sapphire substrate is rotated around the "c" axis by a magnitude of 30°. Therefore, if the mismatching of lattice between sapphire substrate and GaN-based mixed crystal is to be moderately alleviated, the lattice constant of the buffer layer should desirably be smaller than that of a layer to be deposited thereover. When GaN is directly grown on the surface of a sapphire substrate, a GaN layer of island shape is generally resulted so that it is impossible to obtain a flat GaN film. In the case of $Al_xGa_{1-x}N$ (0.2<x<1) however, since the mobility of atom on the crystal growth surface is relatively low, it can be grown directly on the sapphire substrate.

Further, since the growth of the confinement layer is required to be performed at a sufficiently high temperature, the temperature which enables the growth of the buffer layer is required to be higher than the temperature which enables the growth of the confinement layer. Meanwhile, since the maximum temperature enabling the crystal growth is mainly determined by the molar fraction of Al contained in $Al_xGa_{1-x}N$, the content of Al in the buffer layer is required to be larger than that of the confinement layer. However, if Ga is not contained at all in the buffer layer, impurities may diffuse into the substrate. Therefore, the buffer layer should desirably be formulated to contain a very small amount of Ga. When the buffer layer is annealed after the accomplishment of growth thereof at a higher temperature than that employed in the growth thereof, any strain resulting from the mismatching of lattice can be almost completely alleviated.

The film thickness of the buffer layer should preferably be not less than 20 nm and not more than 0.3 $\mu$m. If the film thickness of the buffer layer is less than 20 nm, it would be difficult to completely cover the surface of the substrate. On the other hand, if the film thickness of the buffer layer exceeds over 0.3 $\mu$m, cracks may be generated in the buffer layer. The temperature for annealing the buffer layer is preferably in the range of 1350° C. to 1500° C., and the time period for annealing the buffer layer should preferably be in the range of 10 minutes to 60 minutes. If the annealing temperature is less than 1350° C., it would be difficult to alleviate strain completely. On the other hand, if the annealing temperature exceeds over 1500° C., surface decomposition may be caused. If the aforementioned annealing time is less than 10 minutes, it would be difficult to sufficiently alleviate strain. On the other hand, if this annealing time exceeds over 60 minutes, contamination of the surface may be caused.

Figure 5:
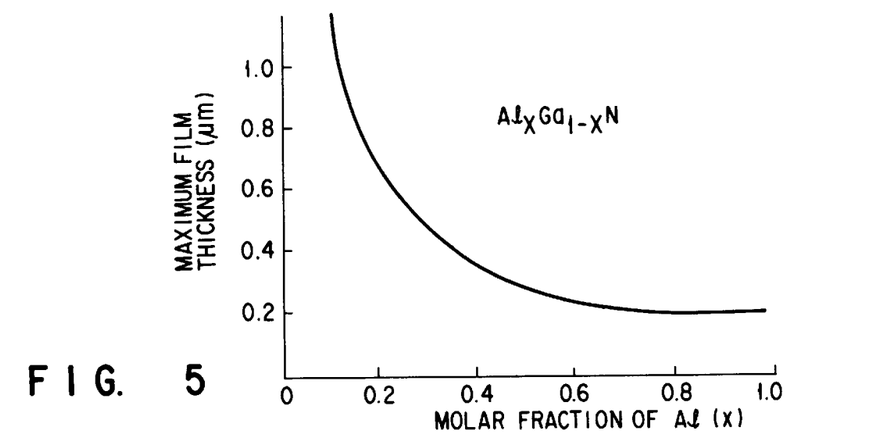
FIG. 5 is a graph showing a relationship between Al molar fraction "x" in $Al_xGa_{1-x}N$ and the maximum film thickness which enables the growth of crystal layer to be effected without giving rise to the generation of cracks.

Additionally, the relationship between the composition of the buffer layer and the film thickness of the $Al_xGa_{1-x}N$ layer which can be grown on the buffer layer has been investigated. Specifically, an AlN(Ga) was grown up to a thickness of 100 nm on sapphire "c" face substrate at a temperature of 1350° C., and then resultant AlN(Ga) was annealed at a temperature of 1450° C. for 30 minutes to form a buffer layer. Then, various kinds of the $Al_xGa_{1-x}N$ compositions were grown using this buffer layer. The FIG. 5 is a graph showing the relationship between Al molar fraction "x" in $Al_xGa_{1-x}N$ and the maximum film thickness which enables the growth of the $Al_xGa_{1-x}N$ layer to be effected without giving rise to the generation of cracks. As apparent from the comparison between this FIG. 5 and FIG. 1 illustrating the prior art, the range in film thickness of the $Al_xGa_{1-x}N$ layer which can be grown without giving rise to the generation of cracks was expanded (or improved) in any of the compositions according to this invention over that of the conventional construction. In particular, in the case of the compositions where the molar fraction (x) of Al is 0.2 or more, the improvement was found to be remarkable.

This invention will be further explained with reference to the following specific examples.

EXAMPLE 1

Figure 6:
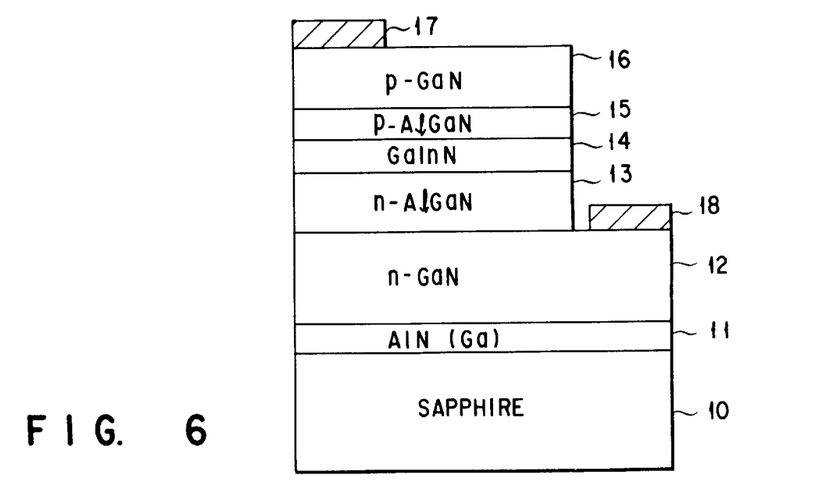
FIG. 6 is a cross-sectional view illustrating the element structure of a greenish blue light-emitting diode according to a first example of this invention.

FIG. 6 shows a cross-sectional view illustrating the element structure of a greenish blue light-emitting diode according to a first example of this invention.

Referring to FIG. 6, a buffer layer 11 formed of AlN(Ga) and having a thickness of 100 nm, and a first contact layer 12 formed of a Si-doped n-type GaN (5.0 $\mu$m) were successively formed on a sapphire "c" face substrate 10. Further, a double heterojunction structure comprising a first confinement layer 13 constituted by a Si-doped n-type $Al_{0.25}Ga_{0.75}N$ (0.3 $\mu$m) functioning as an element, an active layer 14 constituted by GaN (0.05 $\mu$m) containing Zn and Se, and a second confinement layer 15 constituted by Mg-doped p-type $Al_{0.2}Ga_{0.8}N$ (0.3 $\mu$m) is formed on the first contact layer 12. Additionally, a second contact layer 16 constituted by Mg-doped p-type GaN (0.5 $\mu$m) is formed on the second confinement layer 15.

The buffer layer 11 was formed in such a manner that after the growth thereof at a temperature of 1350° C., the buffer layer was annealed at a temperature of 1400° C. for 30 minutes in an atmosphere comprising a mixture of $NH_3$ and hydrogen gas to remove any strain resulting from the mismatching of lattice.

The concentration of each of Zn and Se in the active layer 14 should desirably be in the range of $10^{18}cm^{-3}$ to $10^{20}cm^{-3}$. The combination of Zn and Se is superior over the combination of Zn and Si in the controllability of light-emitting wavelength, since Se is always occupying the lattice site of Group V elements. The reason for making the band gap of the first confinement layer 13 narrower than the band gap of the second confinement layer 15 is that since the effective mass of hole is relatively heavy, a satisfactory confinement effect can be achieved even if the band gap is narrow, and that any voltage drop between the first confinement layer and the contact layer should desirably be minimized.

A p-type electrode 17 having a laminated structure comprising Pd 500 nm in thickness, Cr 100 nm in thickness and Au 500 nm in thickness is formed on the second contact layer 16. Further, a predetermined region of the laminated structure including the second contact layer 16, the second confinement layer 15, the active layer 14 and the first confinement layer 13 is etched away to expose part of the surface of the first contact layer 12, on which an n-type electrode 18 of laminated structure comprising an AuGe layer 100 nm in thickness and an Au 500 nm layer in thickness is mounted. These p-type electrode 17 and n-type electrode 18 are heat-treated after the depositions thereof at a temperature of 400 to 800° C. in an inert gas or nitrogen gas atmosphere thereby forming ohmic electrodes.

At the occasion of growing the monocrystal AlN(Ga) buffer layer 11 according to this invention, the flow rate of $NH_3$ gas as a nitrogen source was extremely decreased to $\frac{1}{10}$ to $\frac{1}{100}$ of the flow rate employed in the occasion of growing other layers. The purpose of reducing the $NH_3$ gas flow rate is to avoid the nitrification in the initial stage of the substrate. Specifically, the partial pressure of $NH_3$ gas was set to the range of 0.1 to 10 Torr. A suitable range of film thickness for the AlN(Ga) buffer layer 11 is 30 nm to 500 nm. If the film thickness of the AlN(Ga) buffer layer 11 is less than 30 nm, it is impossible to form the buffer layer 11 as a completely continuous film so that the quality of crystal of the layer deposited on the buffer layer 11 would be deteriorated. If the film thickness of the buffer layer 11 is too thick, the generation of cracks would be resulted.

As explained above, since the AlN(Ga) buffer layer 11 formed on the surface of the sapphire substrate 10 in this example was formed of monocrystal excellent in quality, it was possible to improve the quality of crystal in each layer constituting a double heterojunction structure. Moreover, since the buffer layer 11 employed in this example was formed of monocrystal excellent in quality, the film thickness of the AlGaN clad layers 13 and 15 can be sufficiently increased, so that it is possible to manufacture a bright short wavelength light-emitting diode in high yield.

EXAMPLE 2

Figure 7:
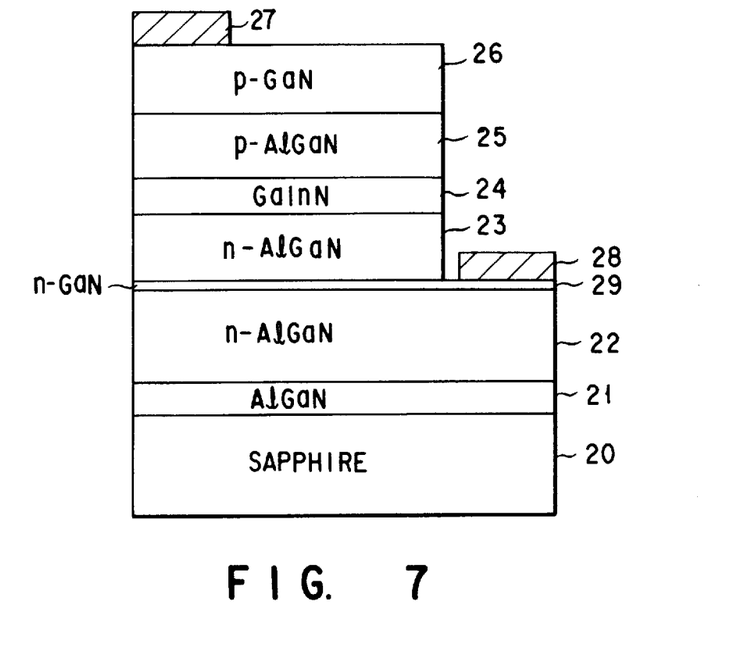
FIG. 7 is a cross-sectional view illustrating the element structure of a greenish blue light-emitting diode according to a second example of this invention.

FIG. 7 shows a cross-sectional view illustrating the element structure of a greenish blue light-emitting diode according to a second example of this invention. The reference numerals 20 to 28 correspond to the reference numerals 10 to 18. As shown in FIG. 7, an n-type GaN layer 29 is interposed between the first contact layer 22 constituted by n-type AlGaN and a first confinement layer 23 constituted by n-type AlGaN.

In this example, an AlGaN layer having the same composition as those of the confinement layers 23 and 25 was employed as a buffer layer 21. Therefore, it was possible to completely conform the lattice constant of the buffer layer 21 with the lattice constant of each of the confinement layers 23 and 25, thereby making it possible to employ a confinement layer of increased film thickness. The molar fraction of Al in the confinement layer 23 should preferably be set to not less than 0.2 and not more than 0.5. If this molar fraction of Al is less than 0.2, it would be very difficult to inhibit the island-like growth. On the other hand, if the molar fraction of Al exceeds over 0.5, it may give rise to a mismatching in lattice constant between the confinement layer 23 and the active layer 24.

As for the p-type dopant, carbon and magnesium may be employed for the confinement layer 25 and the contact layer 26, respectively. When the molar fraction of Al is 0.25 or more, carbon can be effectively entrapped in the confinement layer 25. Therefore, the molar fraction of Al in the confinement layer 25 should preferably be in the range of 0.25 to 0.5.

EXAMPLE 3

Figure 8:
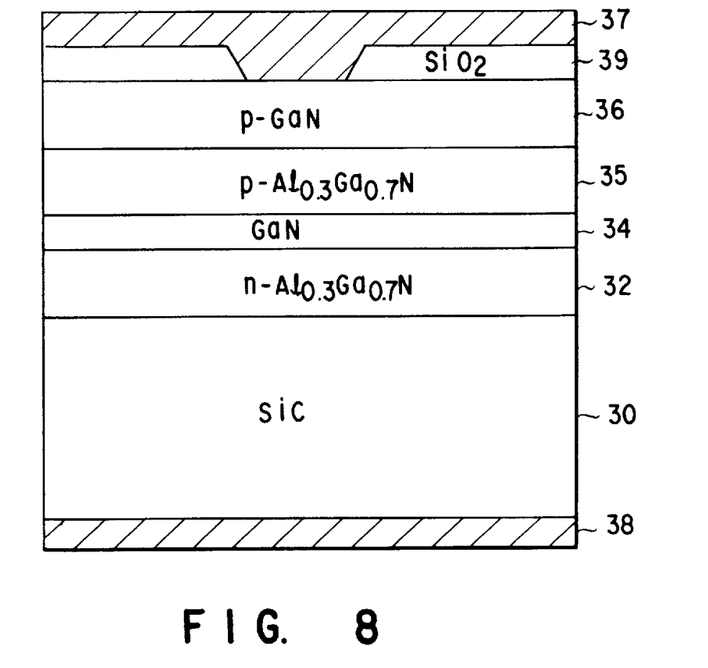
FIG. 8 is a cross-sectional view illustrating the element structure of a semiconductor laser according to a third example of this invention.

FIG. 8 shows a cross-sectional view illustrating the element structure of a semiconductor laser according to a third example of this invention. In this example, a confinement layer 32 is grown directly on the surface of a SiC substrate 30.

Referring to FIG. 8, a first confinement layer 32 constituted by an n-type $Al_{0.3}Ga_{0.7}N$, an active layer 34 constituted by GaN, and a second confinement layer 35 constituted by p-type $Al_{0.3}Ga_{0.7}N$ are successively formed on the surface of a monocrystal SiC substrate 30, thereby forming a double heterojunction structure thereon. A p-type GaN contact layer 36 is formed on this double heterojunction structure. Further, a $SiO_2$ film 39 having a stripe-like opening and a p-type electrode 37 are successively formed on the contact layer 36. An n-type electrode 38 is formed on the back surface of the SiC substrate 30.

According to this example, since the first confinement layer 32 constituted by AlGaN is formed directly on the surface of monocrystalline SiC, it is possible to make the first confinement layer 32 into a monocrystal excellent in quality. If a confinement layer is formed directly on a substrate in this manner, a layer such as a GaN layer which contains a lesser amount of Al fraction than that of the confinement layer would not be interposed between these layers. Namely, the confinement layer 32 can be grown at a high temperature ranging from 1,100° C. to 1,300° C., so that the strain due to a mismatching of lattice can be effectively removed. Accordingly, a film of large thickness can be realized, and at the same time the flatness of interface between the confinement layer 32 and the active layer 34 can be greatly improved, thus making it possible to minimize the working current.

The molar fraction of Al in the confinement layer 32 should preferably be set to not less than 0.2 in view of inhibiting the growth of an island-like growth and not more than 0.5 in view of avoiding a mismatching of lattice. Regarding the film thickness of the confinement layer 32, the film thickness should preferably be at least 0.3 μm, more preferably in the range of 0.5 μm to 1 μm in view of confining light.

As for the p-type dopant, carbon and magnesium may be employed for the confinement layer 35 and the contact layer 36, respectively. When the molar fraction of Al is 0.25 or more, carbon can be effectively entrapped in the confinement layer 35. Therefore, the molar fraction of Al in the confinement layer 35 should preferably be in the range of 0.25 to 0.5.

EXAMPLE 4

Figure 9:
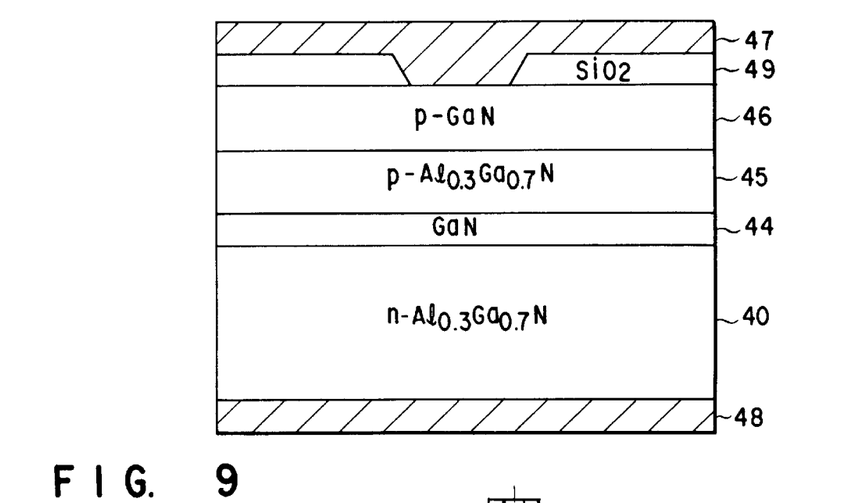
FIG. 9 is a cross-sectional view illustrating the element structure of a semiconductor laser according to a fourth example of this invention.

FIG. 9 shows a cross-sectional view illustrating the element structure of a semiconductor laser according to a fourth example of this invention. In this example, the advantage of this invention that a confinement layer excellent in crystalline quality and having a sufficiently large thickness can be grown is made the most of, so that the substrate is removed via grinding after the growth of the confinement layer.

Namely, a buffer layer constituted by AlN or AlGaN and a clad layer 40 constituted by an n-type $Al_{0.3}Ga_{0.7}N$ are successively formed on the surface of a monocrystal such as sapphire. Then, the substrate and the buffer layer are etched away to expose the clad layer 40 constituted by an n-type $Al_{0.3}Ga_{0.7}N$. Subsequently, an active layer 44 constituted by GaN and a clad layer 45 constituted by p-type $Al_{0.3}Ga_{0.7}N$ are successively formed on the surface of the n-type $Al_{0.3}Ga_{0.7}N$ clad layer 40, thereby forming a double heterojunction structure thereon. A p-type GaN contact layer 46 is further formed on this double heterojunction structure. Then, a $SiO_2$ insulating film 49 having a stripe-like opening and a p-type electrode 47 are successively formed on the contact layer 46. Subsequently, an n-type electrode 48 is formed on the back surface of the clad layer 40.

According to this example, since the substrate and the buffer layer are removed, the n-type electrode 48 can be formed directly on the clad layer 40, so that the heat resistance and electric resistance of the device can be greatly improved as compared with the structure where a SiC substrate is employed.

EXAMPLE 5

Figure 10:
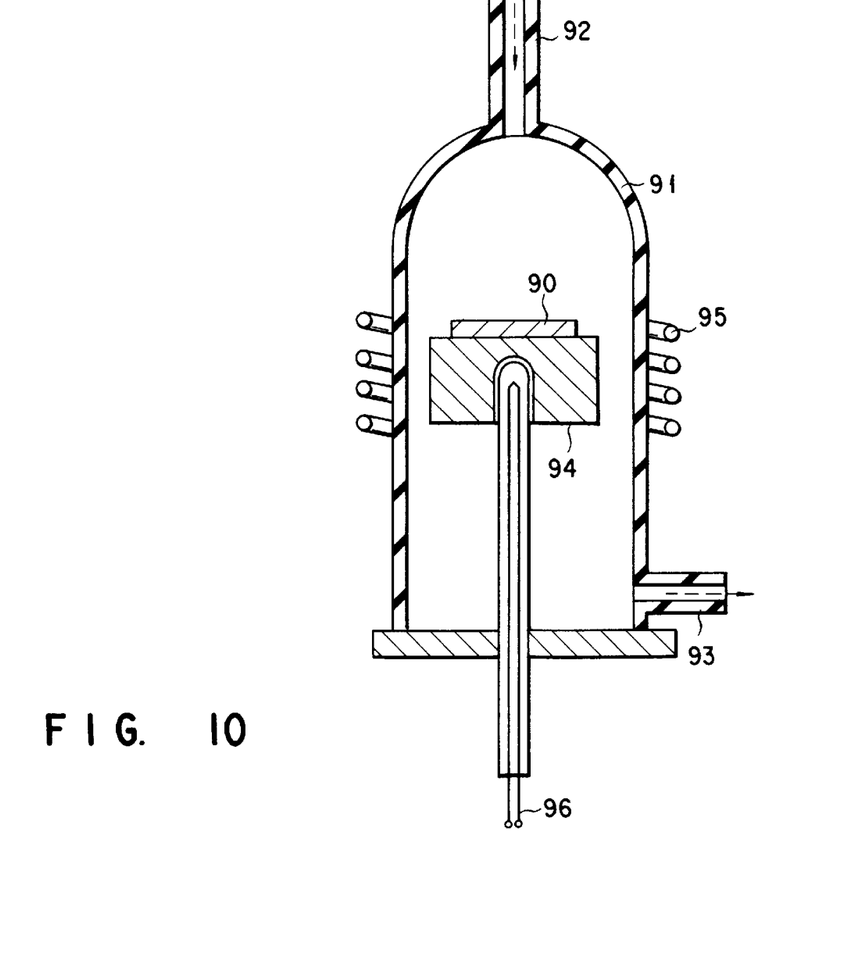
FIG. 10 is a schematic cross-sectional view of a vapor growth apparatus which has been employed in the examples of this invention.

FIG. 10 shows a schematic cross-sectional view of a vapor growth apparatus which has been employed in the manufacture of a semiconductor light-emitting element according to this invention.

Referring to FIG. 10, the reference numeral 91 represents a quartz reaction tube, into which a raw material mixed gas is introduced via a gas inlet port 92. The gas filled in the reaction tube 91 can be discharged from a gas outlet port 93. A susceptor 94 made of carbon is disposed in the reaction tube 91 so as to allow a sample substrate 90 to be mounted on this susceptor 94. This susceptor 94 is adapted to be induction-heated by means of a high frequency coil 95. The temperature of the substrate 90 can be measured by a thermocouple 96 and controlled by an apparatus not shown.

When a film is to be formed, the substrate 90 is first mounted on the susceptor 94, and a high purity hydrogen gas is introduced from the gas inlet port 92 at a flow rate of one liter per minute, thereby substituting the air in the reaction tube 91 by the high purity hydrogen gas. Then, the gas outlet port 93 is connected with a rotary pump to reduce the pressure inside the reaction tube 91 to set the inner pressure of the reaction tube 91 to $10^{-10}$ torr.

Then, the substrate 90 is heated up to 1500° C. in a hydrogen atmosphere thereby cleaning the surface of the substrate 90. After lowering the temperature of the substrate from 1050° C. to 1400° C., $H_2$ gas, nitrogen raw material gas and an organometallic compound are introduced into the reaction tube 91 to carry out the growth of the buffer layer. As for the nitrogen raw material gas, $NH_3$ gas, $N_2H_4$ gas or an organic compound containing nitrogen such as $(CH_3)_2N_2H_2$ can be used. In this case, as a Ga compound, for example $Ga(CH_3)_3$ or $Ga(C_2H_5)_3$ can be employed. As for an Al compound, for example $Al(CH_3)_3$ or $Al(C_2H_5)_3$ can be employed. As for an In compound, for example $In(CH_3)_3$ or $In(C_2H_5)_3$ can be employed. These gases are introduced into the reaction tube 91 to incorporate Al or In into the composition.

If the doping is to be performed, raw material for the doping as explained below is concurrently introduced into the reaction tube 91. As for the n-type dopant, silicon hydride such as an organometallic silicon compound, e.g. $Si(CH_3)_4$, or $H_2Se$ may be employed. As for the p-type dopant, an organometallic magnesium compound such as $Cp_2Mg$, or an organometallic Zn compound such as $Zn(CH_3)_2$, may be employed. For the introduction of carbon, propane gas, ethane or pentane may be employed. When a layer containing In is to be formed in view of improving the uptake ratio of In, the layer should be grown in an atmosphere which is free from hydrogen such as a nitrogen or Ar atmosphere, and a raw material such as $(CH_3)_2N_2H_2$, which is higher in decomposition rate as compared with ammonia is employed.

It is important in view of raising the activation ratio of the p-type dopant to control the cooling condition and to inhibit hydrogen from mixing into the crystal. Namely, the cooling at a temperature condition ranging from growing temperature to 850° C. or 700° C. is performed in ammonia gas in view of inhibiting the dissociation of nitrogen, and the cooling at a temperature condition lower than this temperature range is performed in an inert gas in view of inhibiting the incorporation of hydrogen during the cooling. If the activation ratio of the p-type dopant is required to be further increased, a heat treatment should be performed in nitrogen radicals generated from RF plasma. With this treatment, it is possible to completely prevent the dissociation of nitrogen atoms from the crystal, it is also possible to perform a heat treatment at a high temperature ranging from 900° C. to 1200° C., and at the same time the formation of crystal defects such as nitrogen hole can be prevented.

Specifically, the crystal growth was performed by introducing $NH_3$ gas at a flow rate of $1 \times 10^{-3}$ mol/min, $Ga(CH_3)_3$ at a flow rate of $1 \times 10^{-5}$ mol/min, and $Al(CH_3)_3$ at a flow rate of $1 \times 10^{-6}$ mol/min. The temperature of substrate was set to 1050° C., the pressure 76 torr, and the total flow rate of these raw material gases one liter per minute. As for the n-type dopant, Si and Se were employed, whereas for the p-type dopant, Mg and carbon were employed. $SiH_4$, $H_2Se$, $Cp_2Mg$ and propane were employed as the raw materials.

When the resultant wafer is annealed in nitrogen radicals at a temperature of 400 to 1,000° C., preferably 600 to 800° C., the prevention of drop-out of nitrogen during the annealing or the lowering of resistance of the p-type layer can be realized.

This invention is not limited to the aforementioned examples, but may be modified in various ways. For example, although an element-forming layer was grown directly on the buffer layer formed directly on a monocrystal substrate in the aforementioned examples, the element-forming layer may be grown on the buffer layer via another buffer layer. Further, the composition of the monocrystal buffer layer according to this invention is not limited to those explained in the aforementioned examples, but may be any kinds of composition as long as the composition falls within the definition of $Al_xGa_{1-x}N$ layer (0<x<1). Likewise, the composition of an element-forming layer to be formed on the buffer layer may be any kinds as long as the composition falls within the definition of $Al_xGa_yGa_{1-x-y}N$ (0≦x+Y≦1, 0≦x, Y≦1).

According to the method of this invention, since an $Al_xGa_{1-x}N$ layer (0<x<1) excellent in quality and formed of monocrystal is deposited on a substrate, this deposited monocrystalline $Al_xGa_{1-x}N$ layer (0<x<1) may be employed also as a substrate. Namely, the initial substrate may be etched away in a subsequent step. In this case, the effects such as described below can be obtained. At first, it is possible to perfectly remove strain. Secondly, a process is simplified because the $Al_xGa_{1-x}N$ layer (0<x<1) can be used as a substrate. Third, a operating voltage is lowered due to reduction of a series resistance.

As explained above, according to this invention, a monocrystal AlGaN buffer layer is formed on a monocrystal substrate, and then an element-forming layer constituted by AlGaInN is formed on the buffer layer, so that it has become possible to form a GaInAlN layer which is minimal in crystal defects, and at the same time to realize the manufacture of a bright short wavelength light-emitting element such as a semiconductor laser. Moreover, since the conditions for growing a buffer layer can be alleviated, the productivity of the device can be enhanced.

What is claimed is:

1. A semiconductor light-emitting element comprising:
    a monocrystal substrate;
    a buffer layer formed directly on said monocrystal substrate and comprising a monocrystal $Al_xGa_{1-x}N$ (0<x≦1) layer having a half-value width of an X-ray rocking curve falling within a range of 5 minutes or less, said buffer layer being formed at a high first temperature; and
    an element-forming layer formed on said buffer layer and comprising $Al_xGa_yIn_{1-x-y}N$ (0≦x+y≦1, 0≦x, y≦1), said element-forming layer being formed at a second temperature which is lower than said high first temperature.

2. The semiconductor light-emitting element according to claim 1, wherein a half-value width of an X-ray rocking curve of said buffer layer is 90 seconds or less.

3. The semiconductor light-emitting element according to claim 1, wherein said element-forming layer comprises a heterojunction structure.

4. The semiconductor light-emitting element according to claim 3, wherein said heterojunction structure comprises:
    a first confinement layer constituted by $Al_pGa_{1-p}N$ (0<p≦1);
    an active layer formed on said first confinement layer and constituted by a compound semiconductor selected from the group consisting of GaN, GaInN, AlGaN and AlGaInN; and
    a second confinement layer formed on said active layer and constituted by $Al_qGa_{1-q}N$ (0<q≦1).

5. The semiconductor light-emitting element according to claim 4, wherein said first confinement layer has a film thickness of more than 0.3 μm and the Al molar fraction "p" is in a range of 0.25<p≦1.

6. The semiconductor light-emitting element according to claim 1, wherein said buffer layer has a film thickness falling in the range of from 20 nm to 0.3 μm.

7. The semiconductor light-emitting element according to claim 1, wherein said monocrystal substrate is formed of sapphire or SiC.

8. The semiconductor light-emitting element according to claim 7, wherein said monocrystal substrate is formed of sapphire and the Al molar fraction "x" is in a range of 0.2<x<1.

9. The semiconductor light-emitting element according to claim 1, wherein said element-forming layer comprises a heterojunction structure, said heterojunction structure being constituted by:
    a first confinement layer constituted by $Al_pGa_{1-p}N$ (0<p≦1);
    an active layer formed on said first confinement layer and constituted by a compound semiconductor selected from the group consisting of GaN, GaInN, AlGaN and AlGaInN; and
    a second confinement layer formed on said active layer and constituted by $Al_qGa_{1-q}N$ (0<q≦1).

10. A semiconductor light-emitting element comprising:
    a sapphire substrate;

a buffer layer formed directly on said sapphire substrate and comprising a monocrystal $Al_xGa_{1-x}N$ ($0<x\leq1$) layer having a half-value width of an X-ray rocking curve falling within a range of 90 seconds or less, said buffer layer being formed at a high first temperature; and a double heterojunction structure formed on said buffer layer, said double heterojunction structure being formed at a second temperature which is lower than said high first temperature;

said double heterojunction structure being constituted by:

a first confinement layer constituted by $Al_pGa_{1-p}N$ ($0<p\leq1$);

an active layer formed on said first confinement layer and constituted by a compound semiconductor selected from the group consisting of GaN, GaInN, AlGaN and AlGaInN; and a second confinement layer formed on said active layer and constituted by $Al_qGa_{1-q}N$ ($0<q\leq1$).

11. The semiconductor light-emitting element according to claim 10, wherein said buffer layer has a film thickness falling in the range of from 20 nm to 0.3 µm.

12. The semiconductor light-emitting element according to claim 10, wherein the Al molar fraction "x" of said buffer layer is in a range of 0.2<x<1.

* * * * *